(12) United States Patent
Sauder et al.

(10) Patent No.: US 11,995,383 B2
(45) Date of Patent: *May 28, 2024

(54) SYSTEMS AND METHODS FOR PLACING AND ANALYZING TEST PLOTS

(71) Applicant: CLIMATE LLC, Saint Louis, MO (US)

(72) Inventors: Timothy A. Sauder, Tremont, IL (US); Justin L. Koch, Deer Creek, IL (US)

(73) Assignee: CLIMATE LLC, Saint Louis, MO (US)

( * ) Notice: Subject to any disclaimer, the term of this patent is extended or adjusted under 35 U.S.C. 154(b) by 620 days.

This patent is subject to a terminal disclaimer.

(21) Appl. No.: 17/135,687

(22) Filed: Dec. 28, 2020

(65) Prior Publication Data

US 2021/0209269 A1    Jul. 8, 2021

Related U.S. Application Data

(63) Continuation of application No. 14/125,698, filed as application No. PCT/US2012/042281 on Jun. 13, 2012, now Pat. No. 10,878,141.

(60) Provisional application No. 61/496,486, filed on Jun. 13, 2011.

(51) Int. Cl.
*G06F 30/20* (2020.01)
*A01B 79/00* (2006.01)
*A01C 21/00* (2006.01)
*A01D 34/00* (2006.01)
*A01D 41/127* (2006.01)

(52) U.S. Cl.
CPC ............ *G06F 30/20* (2020.01); *A01B 79/005* (2013.01); *A01C 21/005* (2013.01); *A01D 34/008* (2013.01); *A01D 41/127* (2013.01)

(58) Field of Classification Search
CPC ...... G06F 30/20; A01D 34/008; A01D 41/127
USPC .............................................................. 703/6
See application file for complete search history.

(56) References Cited

U.S. PATENT DOCUMENTS

| | | | |
|---|---|---|---|
| 5,524,424 A | 6/1996 | Halgrimson et al. | |
| 5,915,313 A | 6/1999 | Bender et al. | |
| 2,663,917 A1 | 10/2010 | Schamaltz et al. | |
| 8,782,635 B2 | 7/2014 | Burke | |
| 9,622,403 B2* | 4/2017 | Unruh | A01C 7/163 |
| 2003/0036852 A1* | 2/2003 | Ell | A01C 21/00 |
| | | | 702/5 |
| 2006/0015374 A1 | 1/2006 | Ochs et al. | |
| 2006/0278143 A1 | 12/2006 | Deppermann et al. | |
| 2006/0282296 A1 | 12/2006 | Avey et al. | |
| 2006/0287896 A1 | 12/2006 | McComb et al. | |

(Continued)

OTHER PUBLICATIONS

GRDC_2012 (Variable-rate Application Fact Sheet Mar. 2012) (Year: 2012).*

(Continued)

*Primary Examiner* — Brian S Cook

(74) *Attorney, Agent, or Firm* — Harness, Dickey & Pierce, P.L.C.

(57) ABSTRACT

Systems and methods and apparatus for placing a plot in an agricultural field. Systems and methods are also provided for selecting a plot location based on primary and secondary parameters, for selecting a plot location based on user-defined parameters, and for allowing a user to accept or reject proposed plot placement.

14 Claims, 18 Drawing Sheets

(56) References Cited

U.S. PATENT DOCUMENTS

2011/0113030 A1    5/2011  Hunter et al.

OTHER PUBLICATIONS

Current Claims in application No. 2837484,, dated Apr. 2021, 3 pages.
Canadian Patent Office, "Office Action" in application No. 2837484, dated Apr. 20, 2021, 11 pages.
European Patent Office, "Search Report" in application No. 12 /00 387.8-1655, dated Apr. 3, 2017, 7 pages.
Brosch, "The Effects of Variable-Rate Seedings on Dryland Cotton Yield in West Texas", dated 2008, Texas Tech University, 52 pages.
Canada Claims in application No. 2,837,484, dated Apr. 2019, 4 pages.
Canada Patent Office, "Search Report" in application No. 2,837,484, dated Apr. 3, 2019, 11 pages.
Canadian Claims in application No. 2,837,484, dated Jun. 2020, 3 pages.
Canadian Patent Office, "Search Report" in application No. 2,837,484, dated Apr. 18, 2018, 4 pages.
Canadian Patent Office, "Search Report" in application No. 2,837,484, dated Jun. 16, 2020, 6 pages.
Candian Claims in application No. 2,837,484, dated Apr. 2018, 4 pages.
Current Claims in application No. 2014 00164/(MI-10448), dated Apr. 2017, 3 pages.
Davis et al., "Designing Research and Demonstration Test for Farmer's Fields", dated 2009,UGS Extension, 12 pages.
European Claims in application No. 12 /00 387.8-1655, dated Apr. 2017, 4 pages.
Brosch et al., "The Effects of Variable-Rate Seeding on Dryland Cotton Yield in the West Texas", dated 2008, Texas Tech University, 52 pages.
European Claims in application No. 20150605.2-1011, dated May 2020, 4 pages.
Republica of Argentina, Claims in application No. 20120102096, dated Sep. 2017, 4 pages.
European Patent Office, "Search Report" in application No. 18157532.5-1011, dated Jun. 5, 2018, 7 pages.
European Patent Office, "Search Report" in application No. 20150605.2-1011, dated May 6, 2020, 9 pages.
Freund et al., "Statistical Methods", dated 1993, Academic Press 694 pages.
Gorodissky, Office Action in Application No. 2014 00164/(MI-10448), dated Apr. 17, 2017, 1 page.
Grisso et al., "Preciison Farming Tools: GPS Navigation", dated 2009, Virginia Polytechnic and State Institute pp. 1-7.
Grisso et al., "Precision Farming Tools: GPS Navigation", dated 2009, Virgina Polytechnic and State Institute, pp. 1-7.
Prather et al., "Interpreting Yield Maps", University of Tenessee, 6 pages, dated 2002.
Republica of Argentina, "Office Action" in application No. 20120102096, dated Sep. 4, 2017, 8 pages.
Republica of Argentina, "Translation of Office Action", in application No. 20120102096 dated Sep. 4, 2017, pp. 5 and 6.
European Claims in application No. 1817532.5-1011, dated Jun. 2018, 3, pages.

\* cited by examiner

SYSTEMS AND METHODS FOR PLACING AND ANALYZING TEST PLOTS

CROSS-REFERENCE TO RELATED APPLICATIONS

This application is a continuation of U.S. application Ser. No. 14/125,698, filed May 23, 2014, which is a national stage application of International Application No. PCT/US2012/042281, filed Jun. 13, 2012, which claims the benefit of U.S. Provisional Application No. 61/496,486, filed Jun. 13, 2011, each of which is incorporated by reference herein in its entirety.

BACKGROUND

In recent years, farmers and agronomists have increasingly recognized the importance of population (i.e., the number of seeds planted per acre) in maximizing yield and profit in the cultivation of corn and other crops. There is similar interest in maximizing the economic benefit of other crop inputs such as nitrogen. Thus there is a need in the art for systems and methods for varying application rates and for determining relationships between application rates and yield.

DESCRIPTION

Field Data Gathering System

Figure 1:
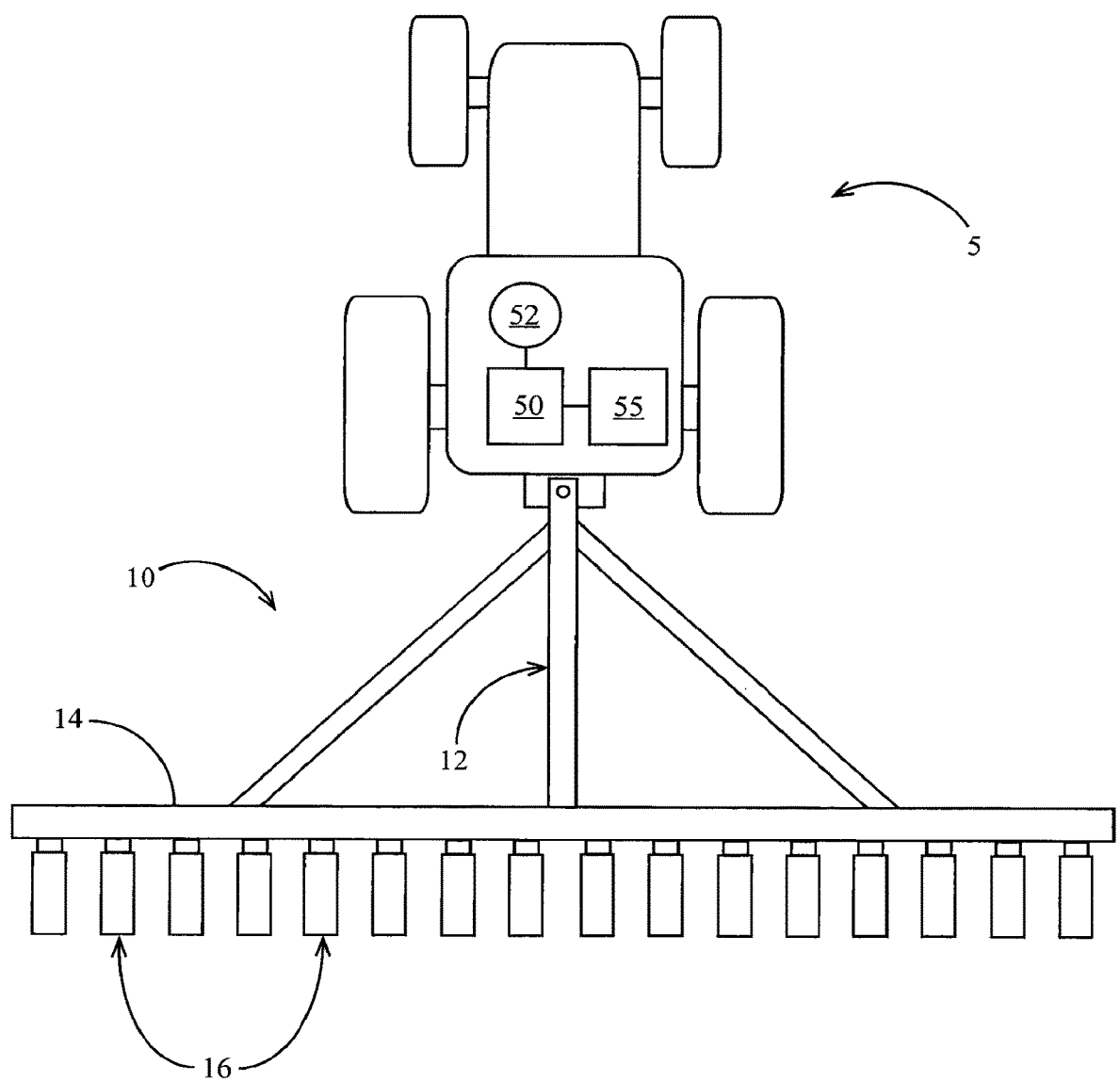
FIG. 1 is a top view of an embodiment of a row crop planter.
Figure 3:
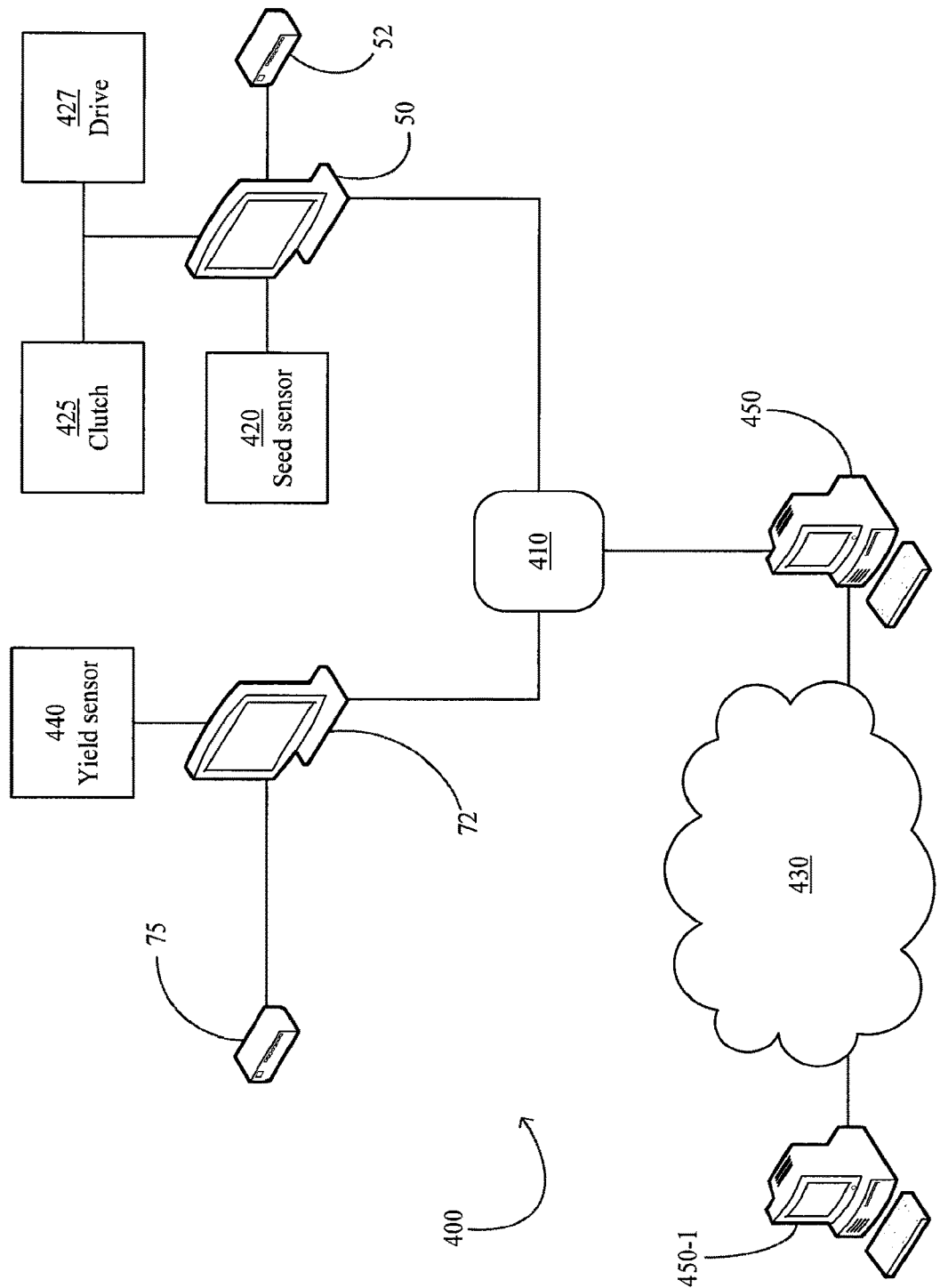
FIG. 3 schematically illustrates an embodiment of a system for gathering, comparing and analyzing planting and yield data.

Referring now to the drawings, wherein like reference numerals designate identical or corresponding parts throughout the several views, FIG. 1 illustrates a top view of a tractor 5 pulling a planter 10 used to plant row crops. The planter 10 includes a frame 12, in which a toolbar 14 extends transversely as a mounting structure for row units 16, each of which is configured to plant seeds in a row as is known in the art. Each row unit 16 is preferably configured to plant at variable population rates (i.e., number of seeds per acre) as is disclosed in U.S. Pat. No. 6,863,006, the disclosure of which is hereby incorporated herein in its entirety by reference. The planter 10 preferably includes one or more drives 427 (FIG. 3), such as hydraulic or electric drives as are known in the art, for varying the population rate planted by each row unit 16 or a group of row units. The planter 10 further preferably includes one or more clutches 425 (FIG. 3) for engaging and disengaging the drives to stop or resume planting at each row units 16 or group of row units. The planter 10 further preferably includes one or more seed sensors 420 (FIG. 3) for detecting the time of seed deposition as well as the population rate planted by each row unit 16. In some embodiments, the seed sensors 420 comprise optical-type sensors such as those disclosed in U.S. Pat. No. 5,936,234. The population rate is preferably controlled by a cab-mounted planter monitor 50, which preferably incorporates a graphical user interface 55, such as disclosed in Applicant's co-pending U.S. patent application Ser. No. 12/522,252, which is hereby incorporated herein in its entirety by reference. A global positioning system ("GPS") device 52 is preferably mounted to the tractor and in electrical communication with the planter monitor 50 for transmitting the current global location of the tractor 5 to the planter monitor 50.

In operation, the planter monitor 50 may be provided with a prescription map file indicating the population rate to be planted at each global location in a field. As the planter traverses the field, the planter monitor 50 commands the row units 16 to plant at the population rate corresponding to the global location currently indicated by the GPS device 52. Simultaneously, the seed sensors 420 report the deposition of each seed to the planter monitor 50 and the planter monitor preferably records the location of each seed and calculates the actual prescription rate for each location in the field.

Figure 2:
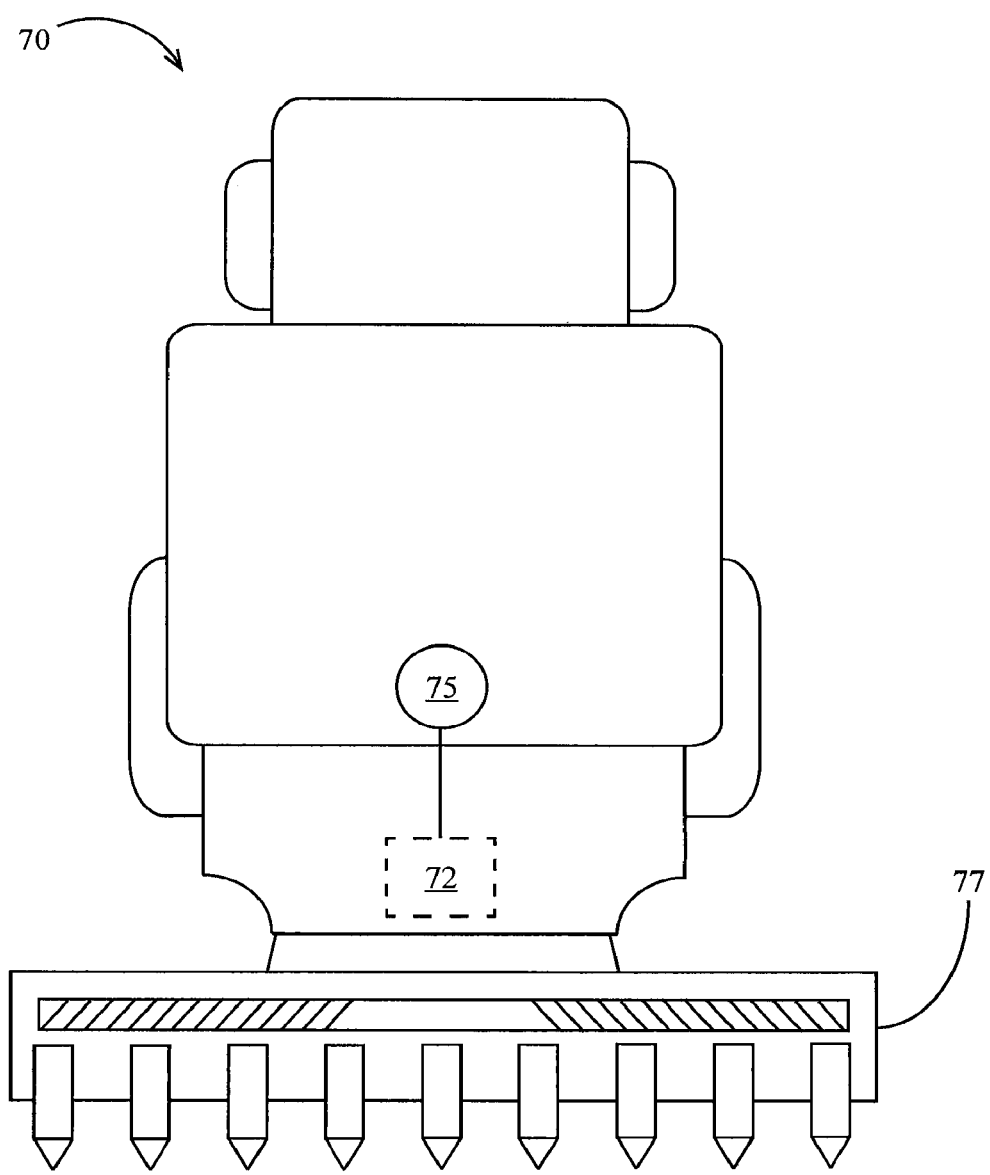
FIG. 2 is a top view of an embodiment of a row crop combine.

FIG. 2 illustrates a top view of a combine 70, such as that illustrated in U.S. Pat. No. 6,226,969, including a head 77 for harvesting crops. The combine 70 preferably includes a yield sensor 440 (FIG. 3) for measuring the near-instantaneous amount of crop being harvested. The yield sensor 440 preferably comprises a sensor configured to measure the flow or amount of grain being harvested, such as an impact-type sensor as disclosed in U.S. Pat. No. 5,561,250, or other types of yield sensors such as disclosed in Applicant's U.S. Provisional Patent Application No. 61/644,367, both disclosures of which are hereby incorporated herein in their entireties by reference. The yield sensor 440 is in electrical communication with a cab-mounted yield monitor 72, which preferably incorporates a graphical user interface, such as that disclosed in Applicant's U.S. Provisional Patent Application No. 61/644,367, previously incorporated by reference. The yield monitor 72 is preferably configured to calculate a yield measurement using a signal from the yield sensor 440 and to display and record the resulting yield measurement. A GPS device 75 mounted to the combine 70 is in electrical communication with the yield monitor 72.

In operation, the yield sensor 440 measures the flow rate or amount of clean grain separated from the crop after being drawn in through head 77. The yield sensor 440 then transmits the resulting yield measurement to the yield monitor 72. Simultaneously, the GPS device 75 transmits a current global location of the combine to the yield monitor 72. The yield monitor 72 preferably displays and records the yield measurement and the associated global location. As a result, a spatial map of yield measurements in the field being harvested may be displayed to the user in the field and is preferably stored for later use.

A system 400 for gathering, comparing and analyzing planting and yield data obtained as described above is illustrated in FIG. 3. The combine GPS device 75 is in electrical communication with the yield monitor 72. The yield monitor 72 is preferably in electrical communication with the yield sensor 440. The planter GPS device 52 is in electrical communication with the planter monitor 50. The planter monitor 50 is preferably in electrical communication with one or more clutches 425, drives 427, and seed sensors 420. Both monitors 50,72 communicate data to a computer 450 via one or more data transfer devices 410. The computer 450 is preferably configured to match planting data to yield data for each location in the field and to perform analysis of the same data as described further herein. In some embodiments, the yield monitor 72 and the planter monitor 50 may be the same unit containing the software for serving both as a planter monitor and as a yield monitor and having the features and functionalities as described above. In other embodiments, the functions performed by the computer 450 are performed by the monitors 72,50, eliminating the necessity of any data transfer device 410.

In some embodiments, the computer 450 is additionally in data communication (as, for example, by an Internet connection) with a server 430. In such embodiments, the computer 450 and other computers 450-1 operated by other users may transmit planting and harvesting data to the server 430. The same data are preferably retrieved by the computer 450 for use in comparing results among fields.

Plot Creation and Harvesting

Figure 4:
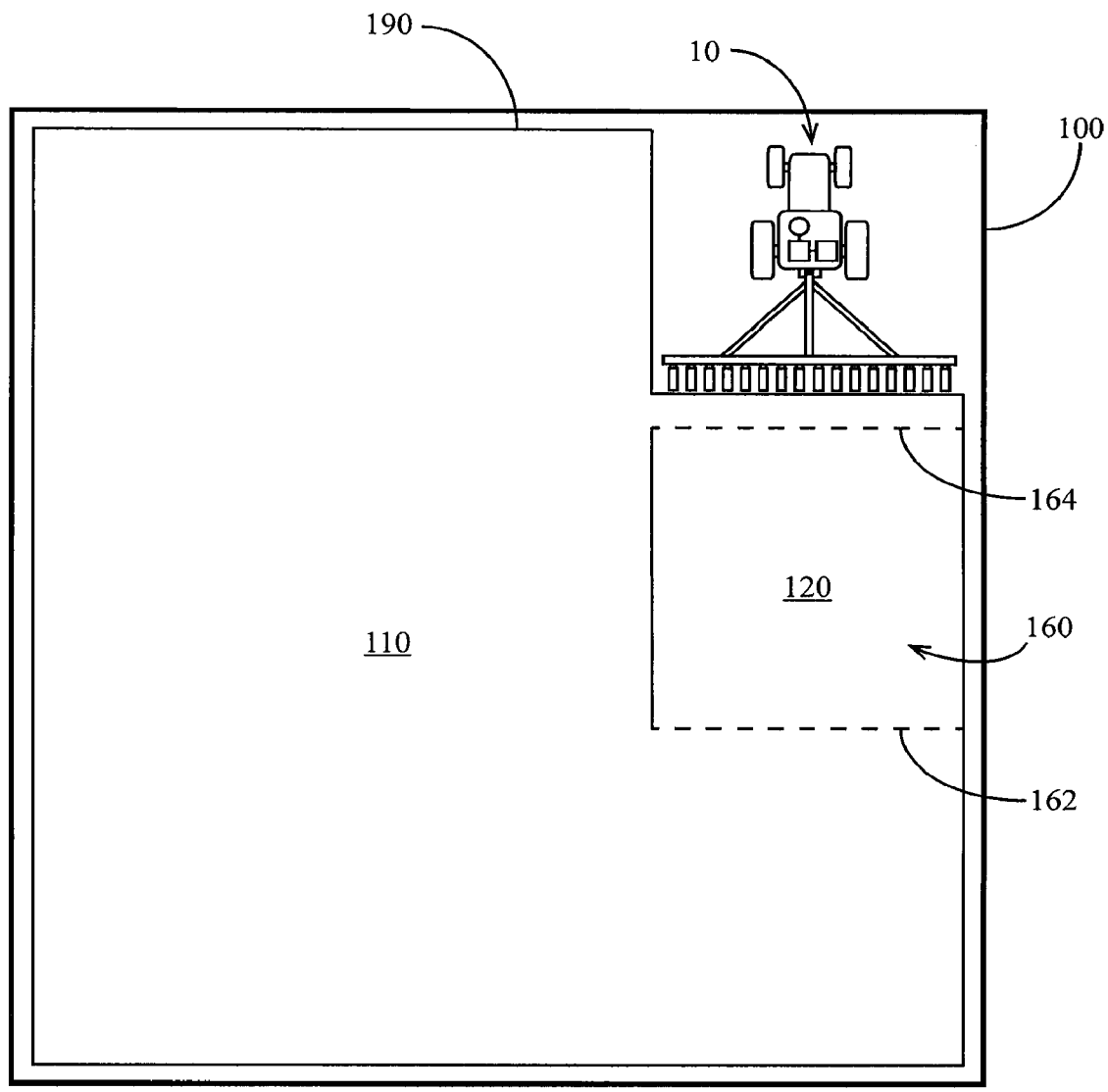
FIG. 4 is a top view of the planter of FIG. 1 planting a field including a test plot.

Referring to FIG. 4, a planter 10 as described above is illustrated in planting operations in a field 100, resulting in a planted area 190. The planter 10 plants the field 100 at a primary population rate indicated by reference numeral 110. The primary population rate 110 constitutes a base rate which the user has determined is desirable for the field 100. As an example, a primary population rate for planting corn may be 30,000 seeds per acre. The user is preferably enabled to experiment with the yield results of a different population by planting at a secondary population rate indicated by reference numeral 120 in a plot 160 within the same field. As an example, a secondary population rate for planting corn may be 32,000 seeds per acre.

In order to generate the plot 160 in which the secondary population rate 120 is planted as illustrated in FIG. 4, the planter monitor 50 (FIG. 1) preferably changes the commanded population rate to the secondary population rate 120 when the GPS device 52 reports that it has reached a first boundary 162. The monitor 50 then changes the commanded population rate back to the primary population rate 110 when the GPS device 52 reports that it has reached a second boundary 164.

Figure 5:
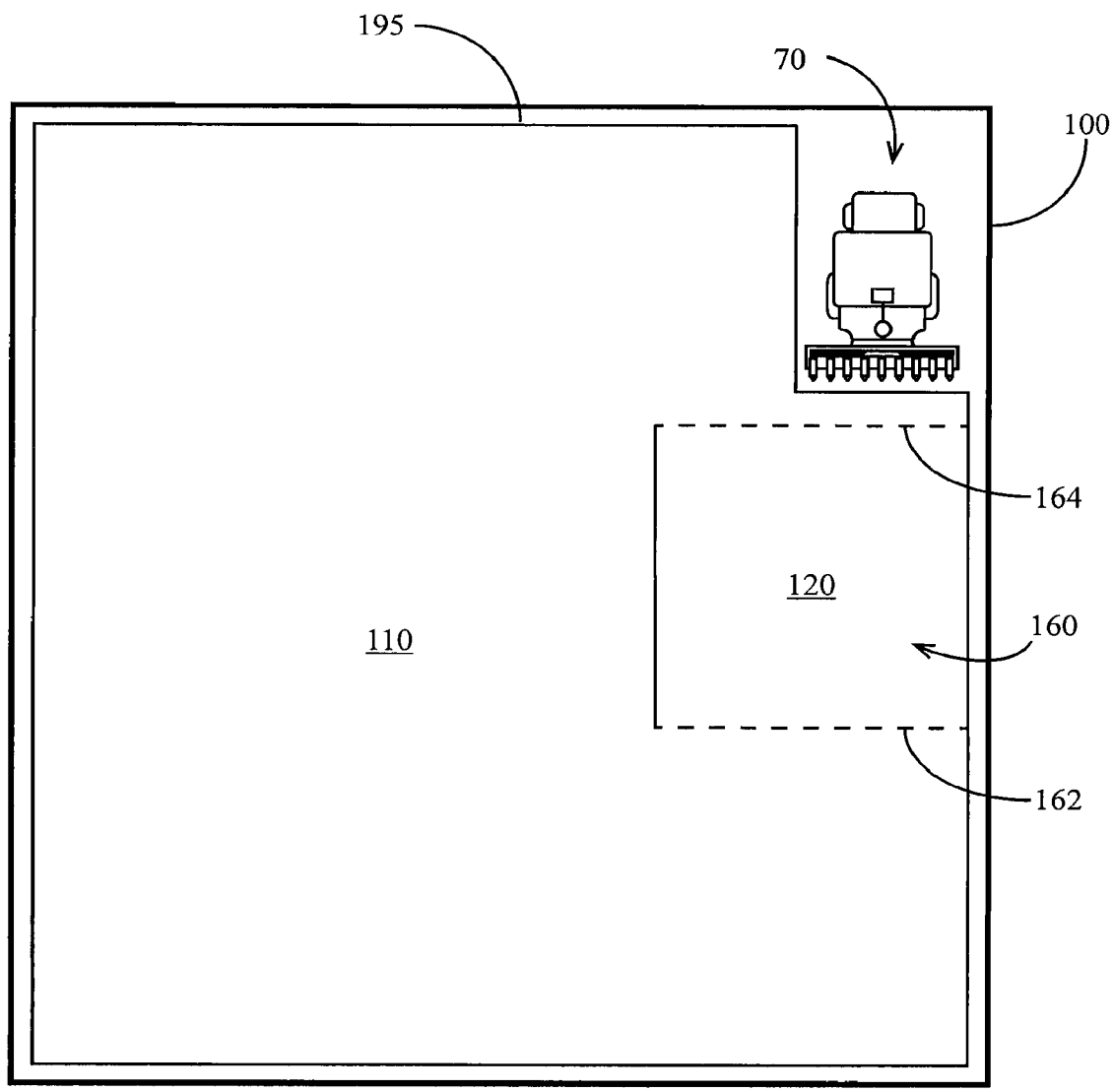
FIG. 5 is a top view of the combine of FIG. 2 harvesting the field and test plot of FIG. 4.

As illustrated in FIG. 5, a combine 70 as described above is illustrated harvesting the field 100 which has been provided with the plot 160. The planted but unharvested area is indicated by reference numeral 195. It should be appreciated that a single yield sensor 440 typically measures the rate or amount of grain being harvested across the entire header 77 (FIG. 2). Thus when the combine crosses the boundary 164 and begins harvesting from the plot 160, the header 77 is preferably aligned to harvest only from the plot 160. In this manner, when reviewing collected yield data it is possible to distinguish between yield results for the primary population rate 110 and the secondary population rate 120.

Figure 6:
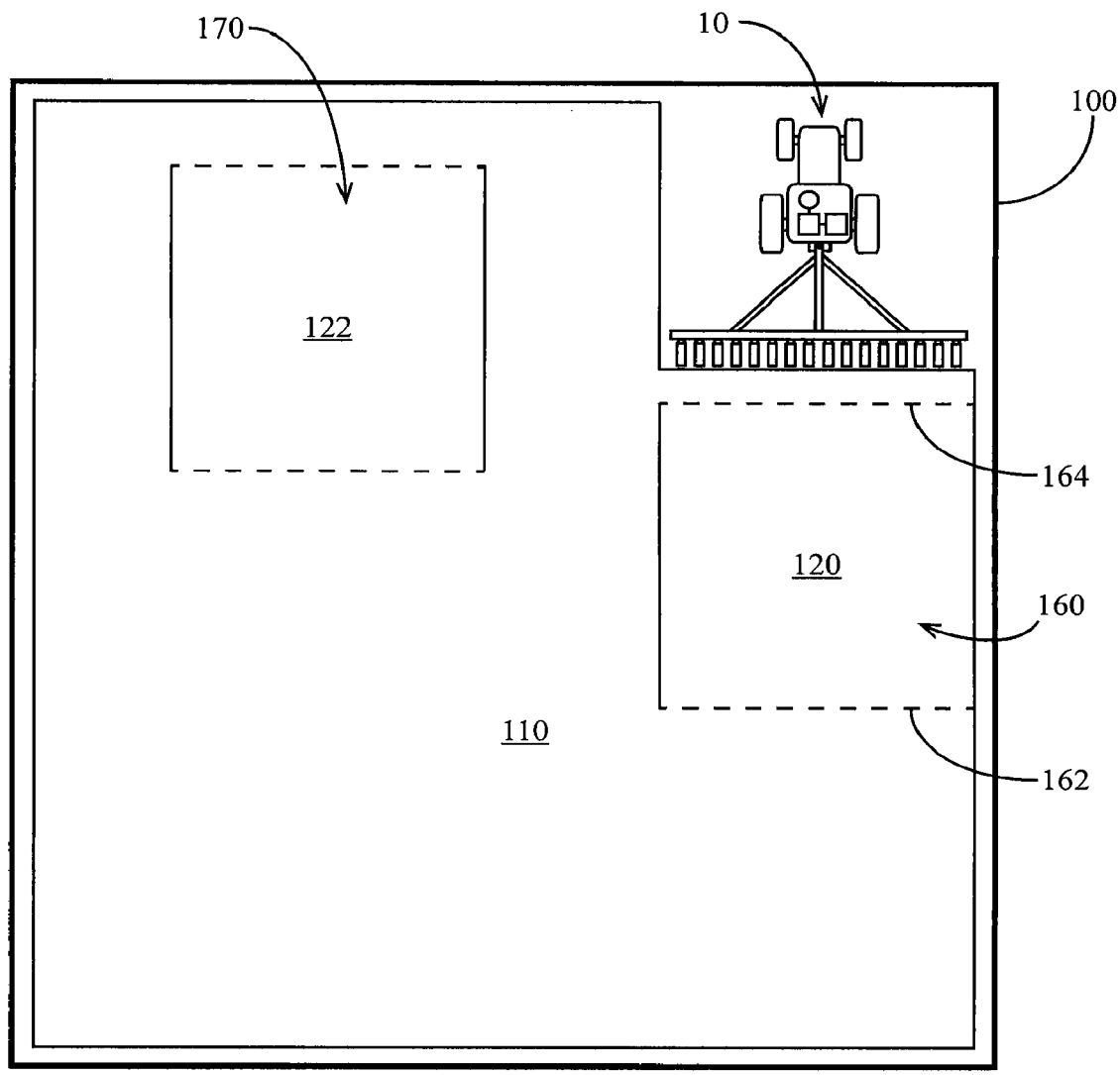
FIG. 6 is a top view of the planter of FIG. 1 planting a field including multiple test plots.
Figure 7:
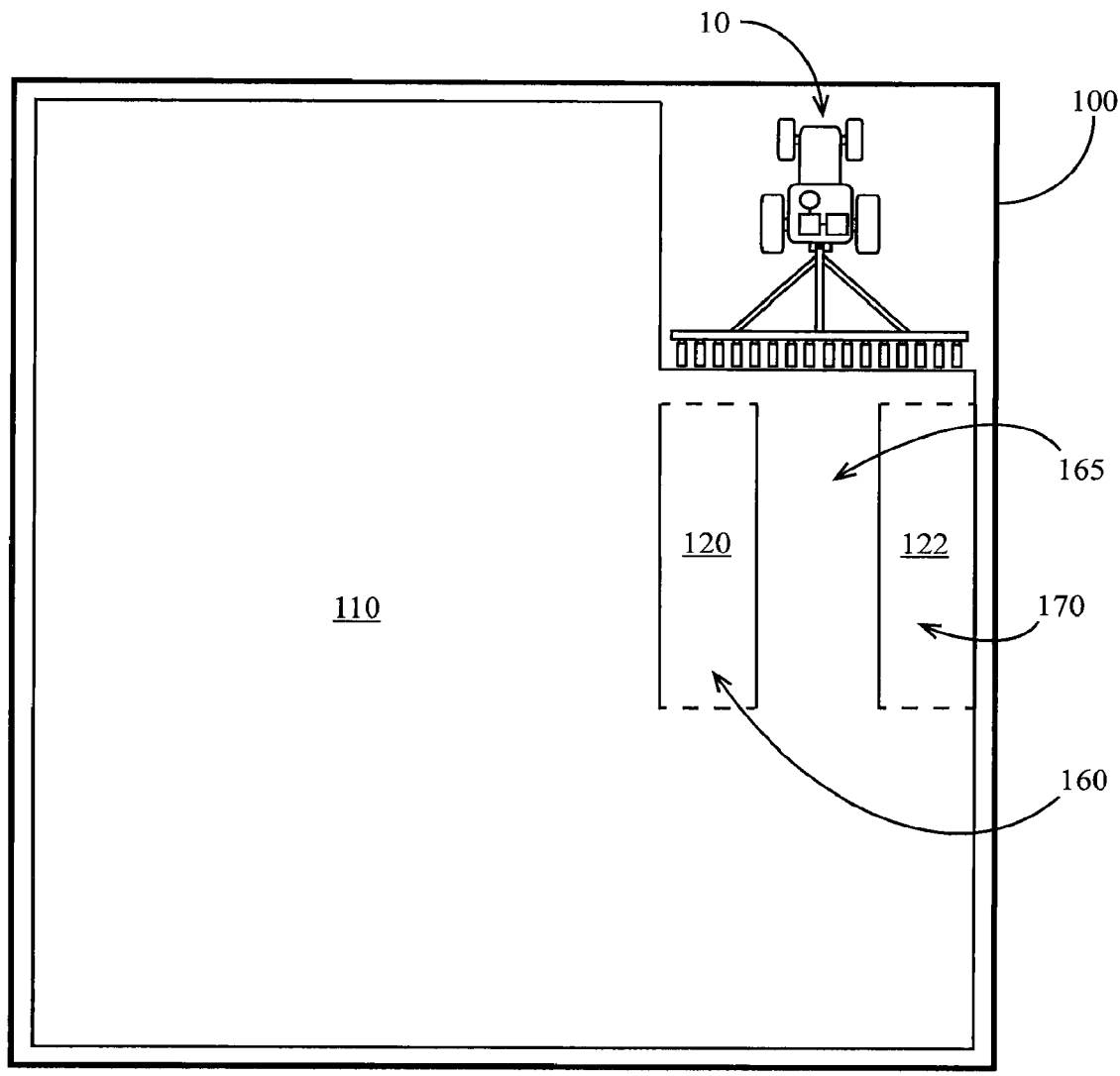
FIG. 7 is a top view of the planter of FIG. 1 planting a field including side-by-side test plots planted in a single pass.
Figure 8:
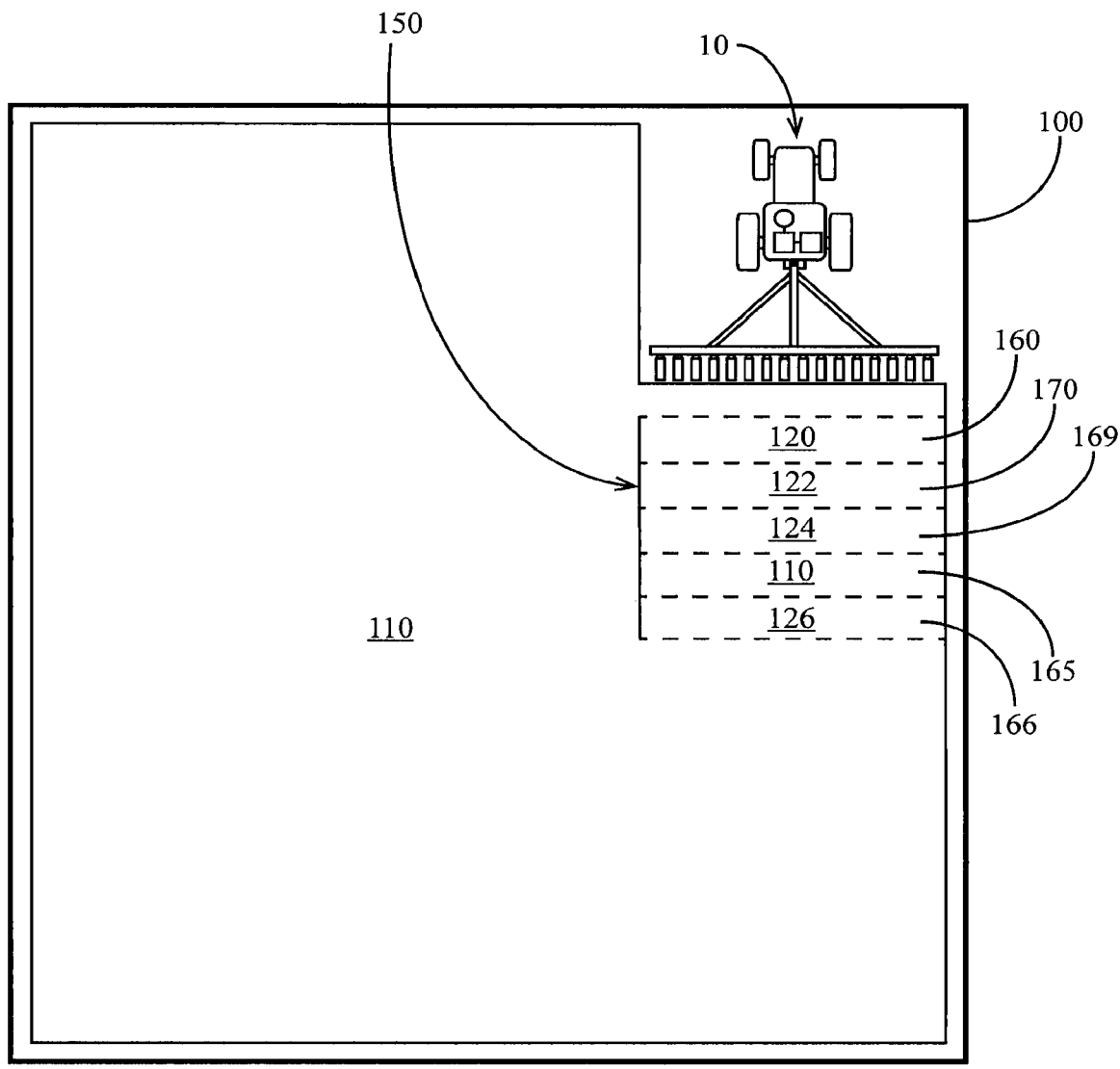
FIG. 8 is a top view of the planter of FIG. 1 planting a field including end-to-end test plots planted in a single pass.

The results of several methods of placing multiple plots in a single field 100 are illustrated in FIGS. 6-8. In FIG. 6, the method used to plant the plot 160 is repeated at a different location in the field in order to generate a second plot 170 in which a tertiary population rate indicated by reference numeral 122 is implemented. In FIG. 7, the planter 10 generates two side-by-side plots 160 and 170 in which population rates 120 and 122 are implemented respectively. The side-by-side plots of FIG. 7 are generated by varying the population rate commanded to individual row units 16 or groups thereof across the toolbar 14. In order to accomplish this method, a separately controlled drive is provided to the row units 16 or groups thereof as described in U.S. Pat. No. 6,070,539, which is hereby incorporated by reference herein in its entirety. When generating such side-by-side plots, the planter 10 is preferably enabled to plant a buffer area 165 planted at the primary population rate 110 in between the plots 160,170. In FIG. 8, a master plot 150 including multiple end-to-end plots 160, 170, 169, 165, and 166 in which population rates 120, 122, 124, 110, and 126 are planted respectively. This method accomplished by changing the commanded population rate between each plot. As illustrated in FIG. 8, the planter monitor 50 changes the commanded rate directly between non-primary population rates (as between, e.g., plots 169 and 170). In addition, the planter monitor 50 commands the primary rate 110 in a buffer area 165 between non-primary population rates (as between, e.g., plots 169 and 166).

Figure 9:
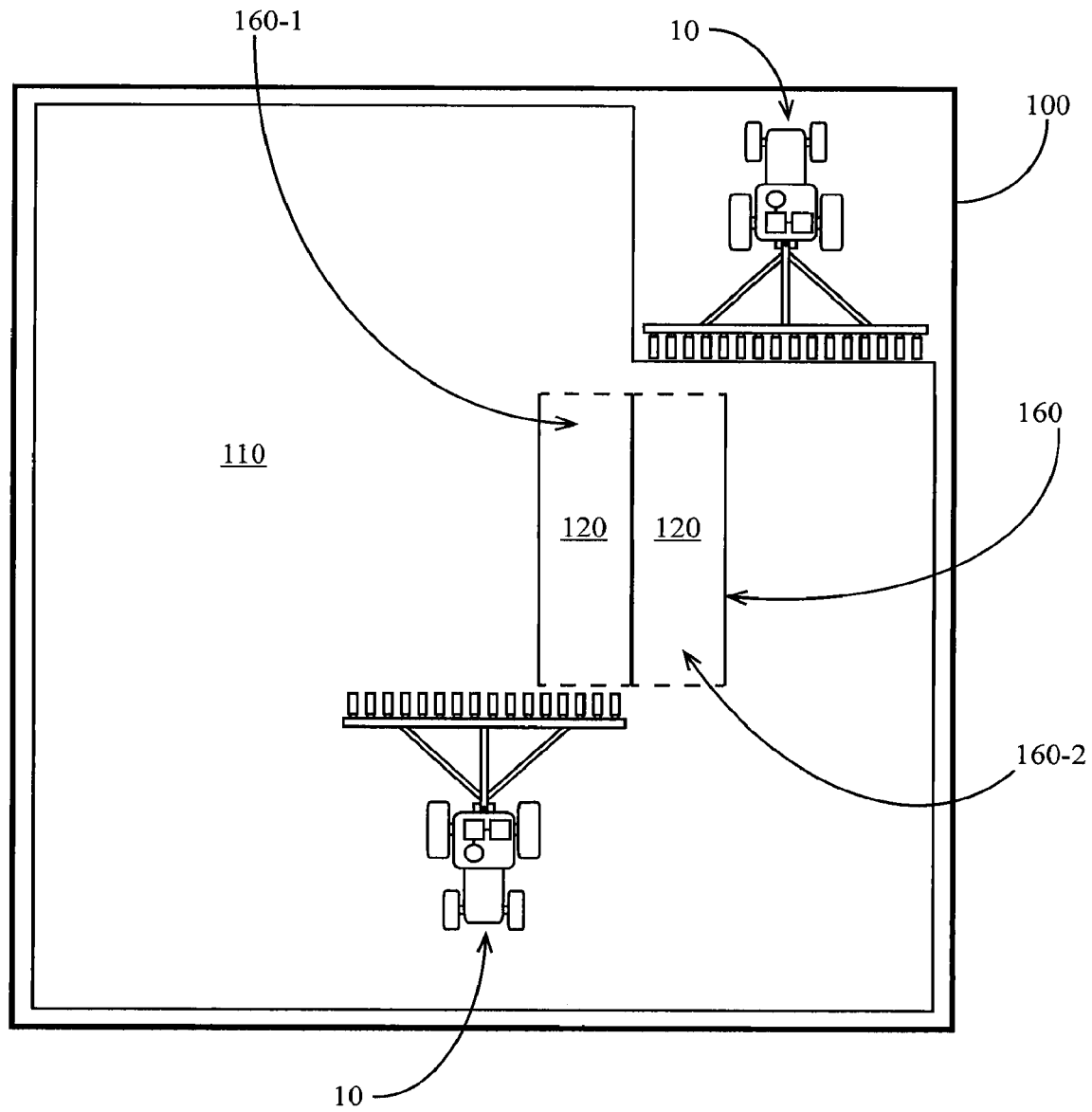
FIG. 9 is a top view of the planter of FIG. 1 planting a field including a single test plot planted in multiple passes.

As illustrated in FIG. 9, the planter 10 is enabled to plant a single plot using multiple passes. A plot 160 having secondary population rate 120 may be planted in two plot sections 160-1, 160-2. The population rate commanded to a group of left-hand row units 16 is changed when crossing an upper boundary of the plot 160 in order to plant the first plot section 160-1. Likewise, the population rate commanded to the same or a different group of left-hand row units 16 is preferably changed when crossing a lower boundary of the plot 160 in order to plant the second plot section 160-2.

Plot Size and Location

Figure 10:
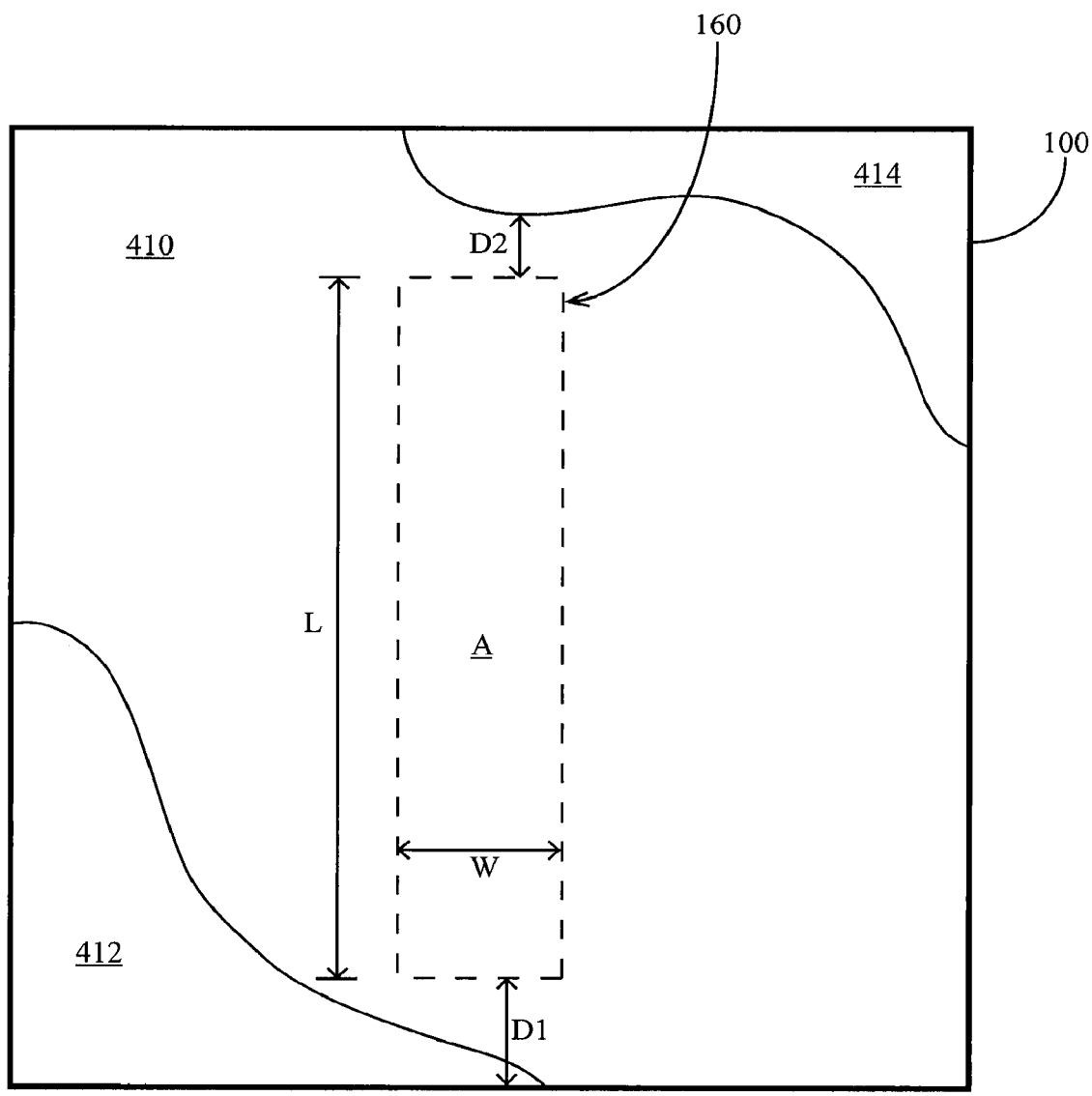
FIG. 10 illustrates the dimensions and location of a test plot overlaid on a soil type map of a field.

Multiple factors affect the preferred size and placement of each plot 160. Referring to FIG. 10, each plot 160 preferably has a critical area A in order to obtain results upon harvesting having a desired statistical significance. As illustrated, the plot 160 has a length L along the direction of planting and harvesting travel and a transverse width W. The width W is preferably a multiple of the width of combine head 77 such that the combine 70 may harvest the entire plot 160 without simultaneously drawing in crops planted at the primary population rate. Further, the desired minimum length L depends in part on the resolution of the combine yield sensor. That is, different styles or models of yield sensors have varying ability to determine whether the flow rates or amounts of grain measured near the fore and aft boundaries of the plot are associated with the plot area or an adjacent area. Where this effect is more significant, longer plot lengths L are preferred.

The desired location of the plot is preferably determined in part by the soil types or the soil productivity across the field. The field 100 of FIG. 10 includes regions having soil types indicated by reference numerals 414,410, and 412. As illustrated, the plot 160 is preferably placed on the predominant soil type 410 of the field 100 (i.e., that present in the largest area of the field). The plot 160 is preferably placed such that the plot is a minimum distance D2 from any soil type other than the soil type of the plot. It should be appreciated that the preferred minimum distance D2 depends on the resolution of the yield sensor. Likewise, the plot 160 is preferably placed such that the plot is a minimum distance DI from any field boundary or waterway.

Figure 11:
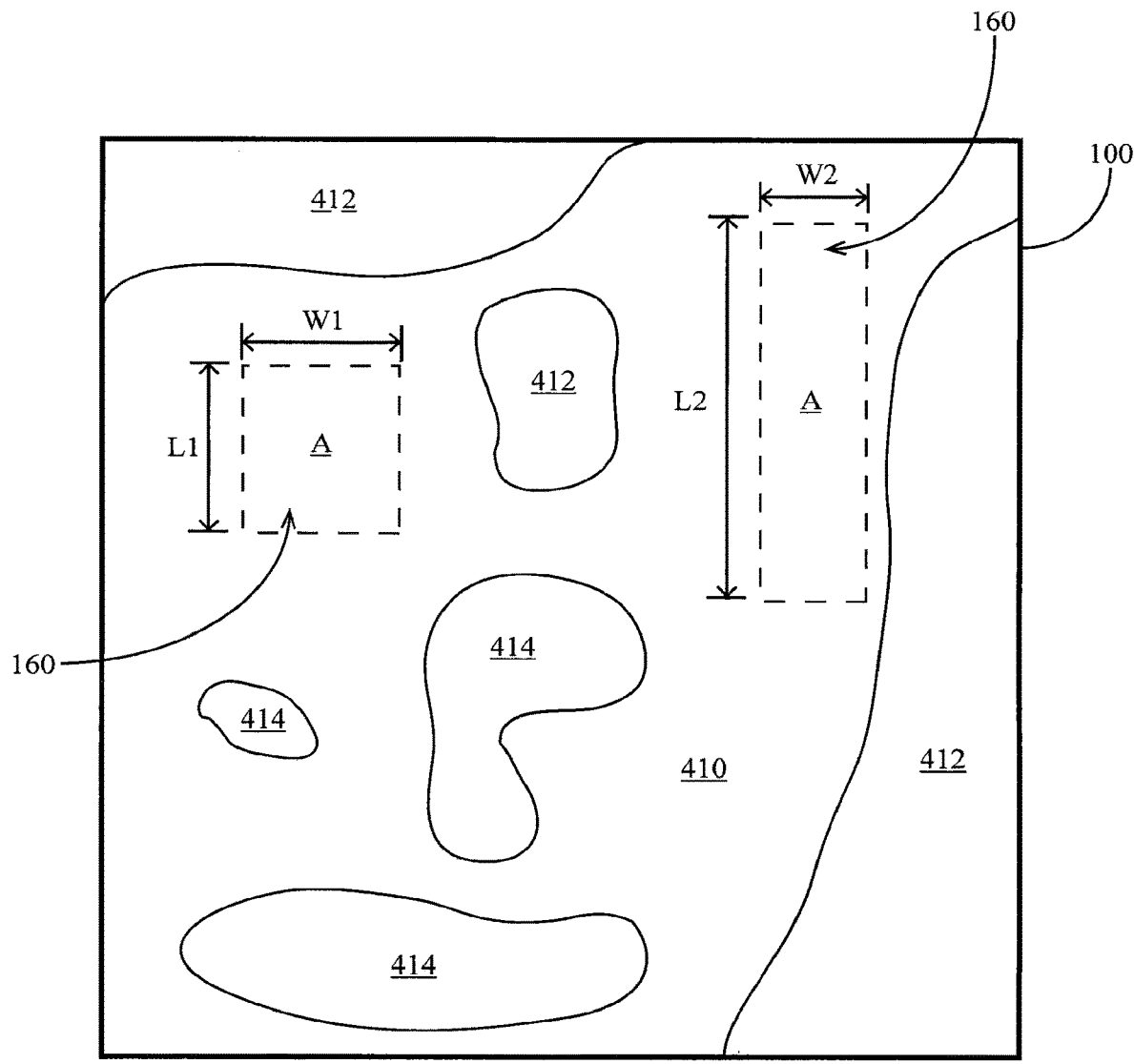
FIG. 11 illustrates the dimensions and location of multiple test plots overlaid on a soil type map of a field.

Referring to FIG. 11, the plot shape may be varied in order to generate a plot having the desired size and location. The field of FIG. 11 includes soil types 410,412, and 414, among which soil type 410 is predominant as illustrated. In order to plant two plots having a desired critical area A within the predominant soil type 410, a first plot 170 having a length L1 and width WI is planted along with a second plot 160 having a length 12 and width W2.

Automatic Plot Placement and Analysis Methods

Figure 13:
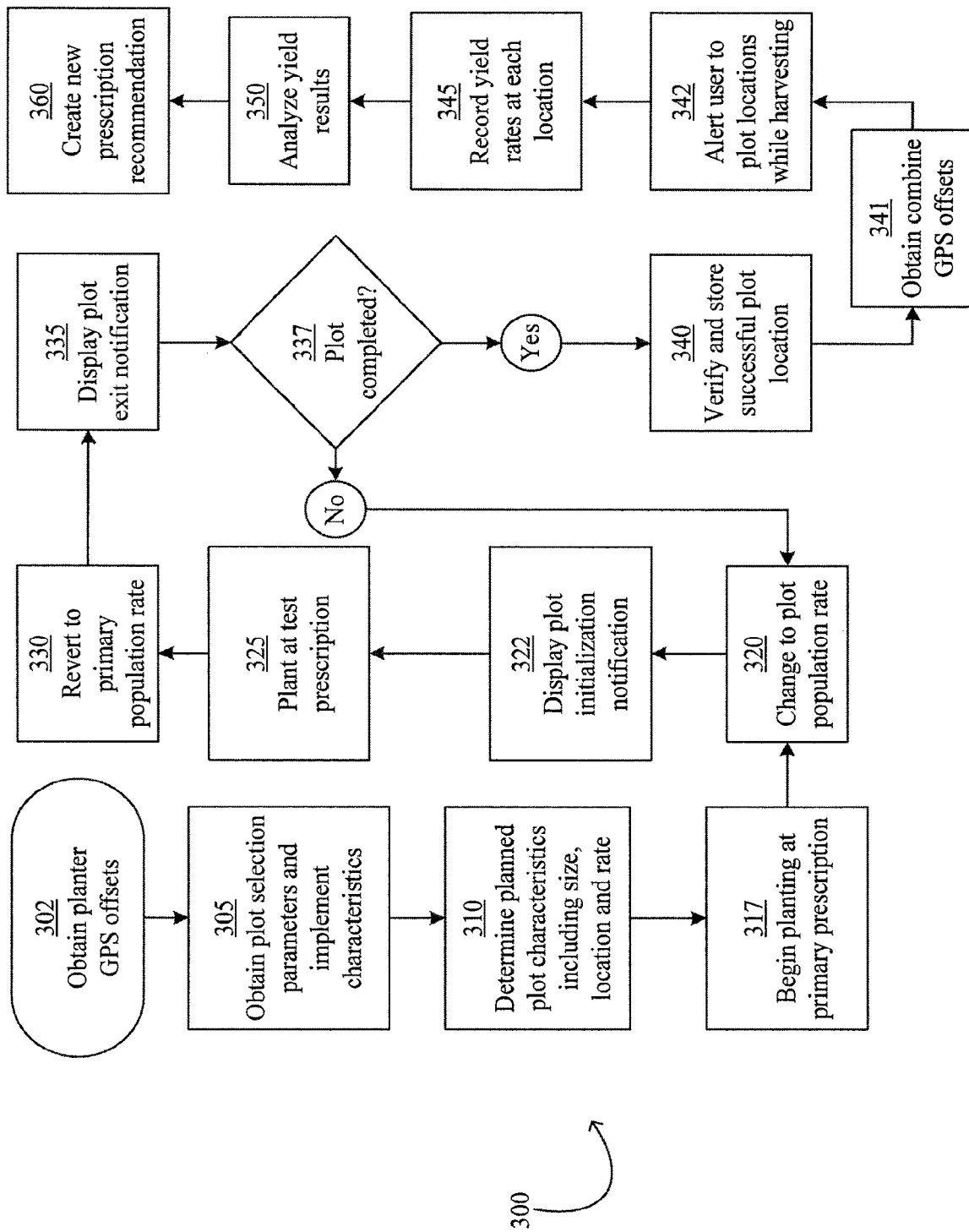
FIG. 13 illustrates an embodiment of a process for placing test plots and analyzing yield data.
Figure 16:
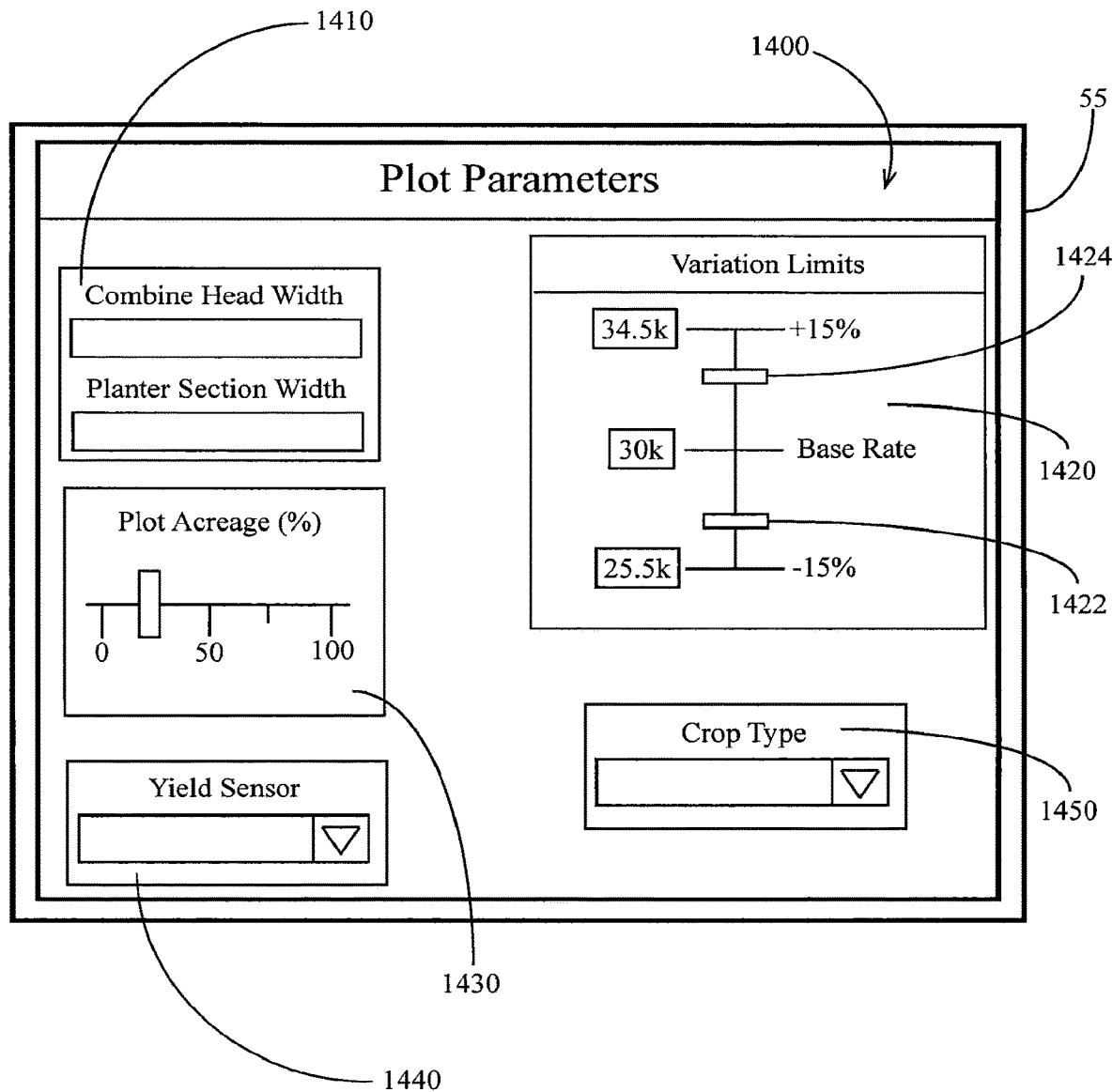
FIG. 16 illustrates an embodiment of a user interface screen for entering user input.

A process 300 of placing plots in a field during planting is illustrated in FIG. 13. At step 302, the planter monitor 50 preferably prompts the user to enter GPS offsets for the planter, i.e., the travel-direction and transverse offsets between the GPS device 52 and each row unit of the planter. At step 305, the monitor 50 preferably prompts the user to provide a set of plot selection parameters and a set of implement characteristics. In order to accomplish this step, the planter monitor preferably displays a screen 1400 for receiving user input as illustrated in FIG. 16 on the graphical user interface 55. In order to enter implement characteristics, the screen 1400 preferably includes an interface 1410 for entering the width (or number and spacing of rows) of the combine head to be used in harvesting and the width (or number and spacing of rows) of independently controlled sections of the planter to be used in planting, an interface 1450 for selecting the type of crop to be planted, and an interface 1440 for selecting the type and model of yield sensor to be used in harvesting. In order to enter plot selection parameters, the screen 1400 preferably includes an interface 1420 for entering the amount of variation in population desired and an interface 1430 for entering the percentage of the field acreage that should be put into plots. In other embodiments, the interface 1430 allows the user to select the ratio between total acreage of plots within a base rate zone (FIG. 18) and the acreage of the base rate zone.

The interface 1420 preferably allows the user to set a maximum prescription variation 1424 and a minimum prescription variation 1422. In some embodiments, the interface 1420 additionally allows the user to select a preferred statistical variation (e.g., a standard deviation) of the plot prescription values. It should be appreciated that some of the plot selection parameters comprise user risk preferences since the amount of acreage placed in plots and the variation in population of the plots represents a quantum of economic risk taken by the user in order to learn optimal population in future seasons. It should be appreciated that the user interfaces may comprise text entry boxes, drop-down menus or sliding scales as illustrated in FIG. 16, or any other suitable interfaces as are known in the art.

Figure 18:
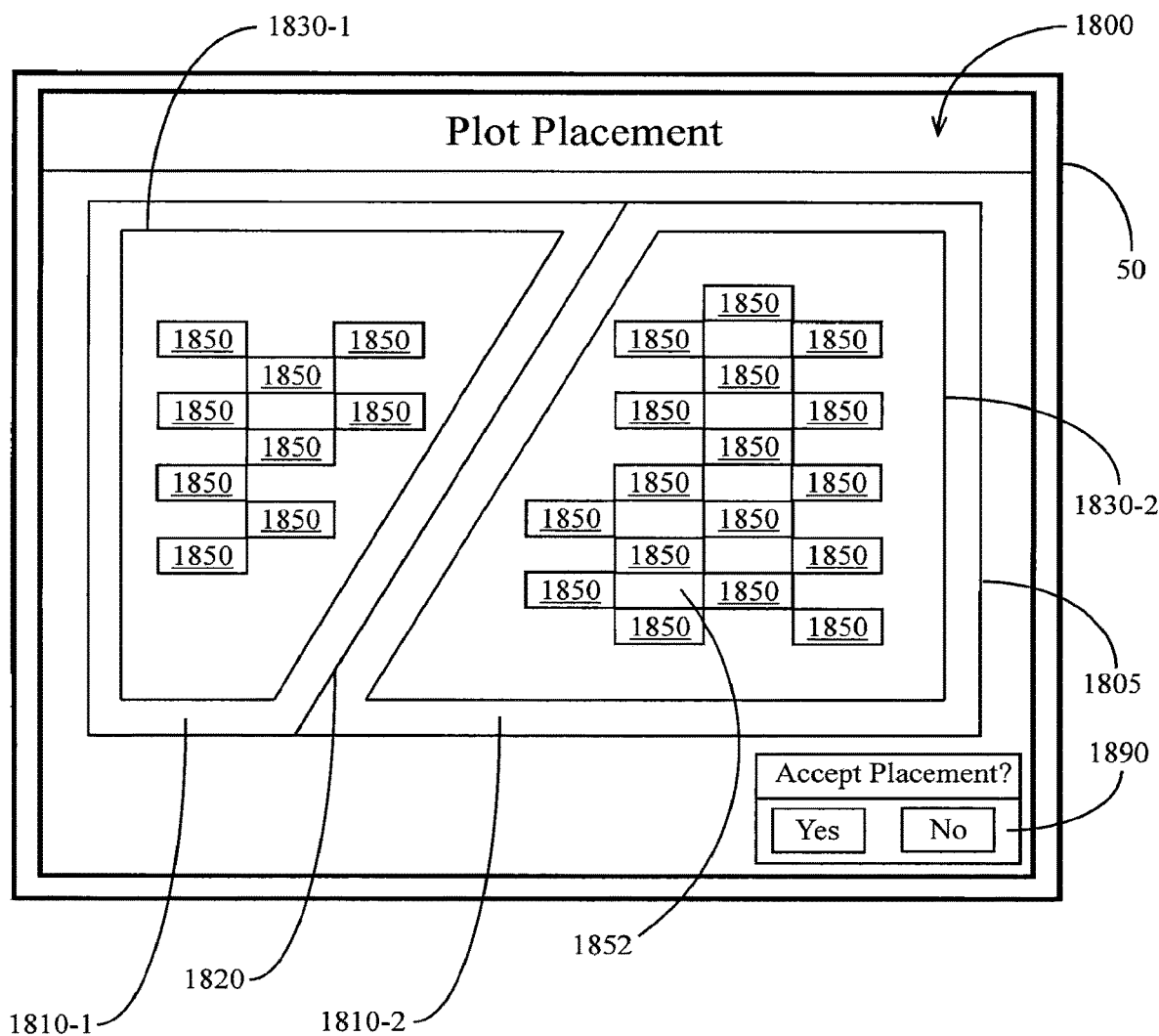
FIG. 18 illustrates an embodiment of a display screen for displaying plot placements within a field boundary.

Returning to FIG. 13, at step 310 the planter monitor 50 preferably determines a set of plot characteristics including the location of the plots, the size of the plots, and the population rates to be planted within the plots. A preferred process for carrying out step 310 of FIG. 13 is illustrated in detail in FIG. 14. In carrying out the steps of the process in FIG. 14, the planter monitor 50 preferably displays a plot placement screen 1800 as illustrated in FIG. 18. At step 1902, the planter monitor 50 preferably identifies a field boundary 1805. In some embodiments, the field boundary 1805 is accessed from a file containing global positioning vertices recorded by the user by driving the boundary of the field with a GPS device as is known in the art. In other embodiments, the field boundary 1805 is accessed in a file containing global positioning vertices entered by the user, e.g., by drawing a boundary around an aerial image of the field as is known in the art. At step 1905, the planter monitor 50 preferably identifies base rate zones 1810 within the field boundary 1805. In FIG. 18, two base rate zones 1810-1, 1810-2 have been identified, separated by a base rate boundary 1820. Base rate zones 1810 are preferably those regions in which the same base population rate is desired. In some embodiments, the base rate zones 1810 are identified by accessing a USDA soil type map including soil type polygons (e.g., as disclosed in Applicant's co-pending PCT Application No. PCT/US11/68219, which is hereby incorporated herein in its entirety by reference, and determining the geometric unions between the field boundary and one or more soil type polygons. In other embodiments, the base rate zones 1810 comprise any region in which certain spatial characteristics of the field (e.g., soil type, drainage features, and elevation) are common. At step 1910, the planter monitor 50 preferably allows the user to set the population rates in the base rate zones 1810.

Figure 14:
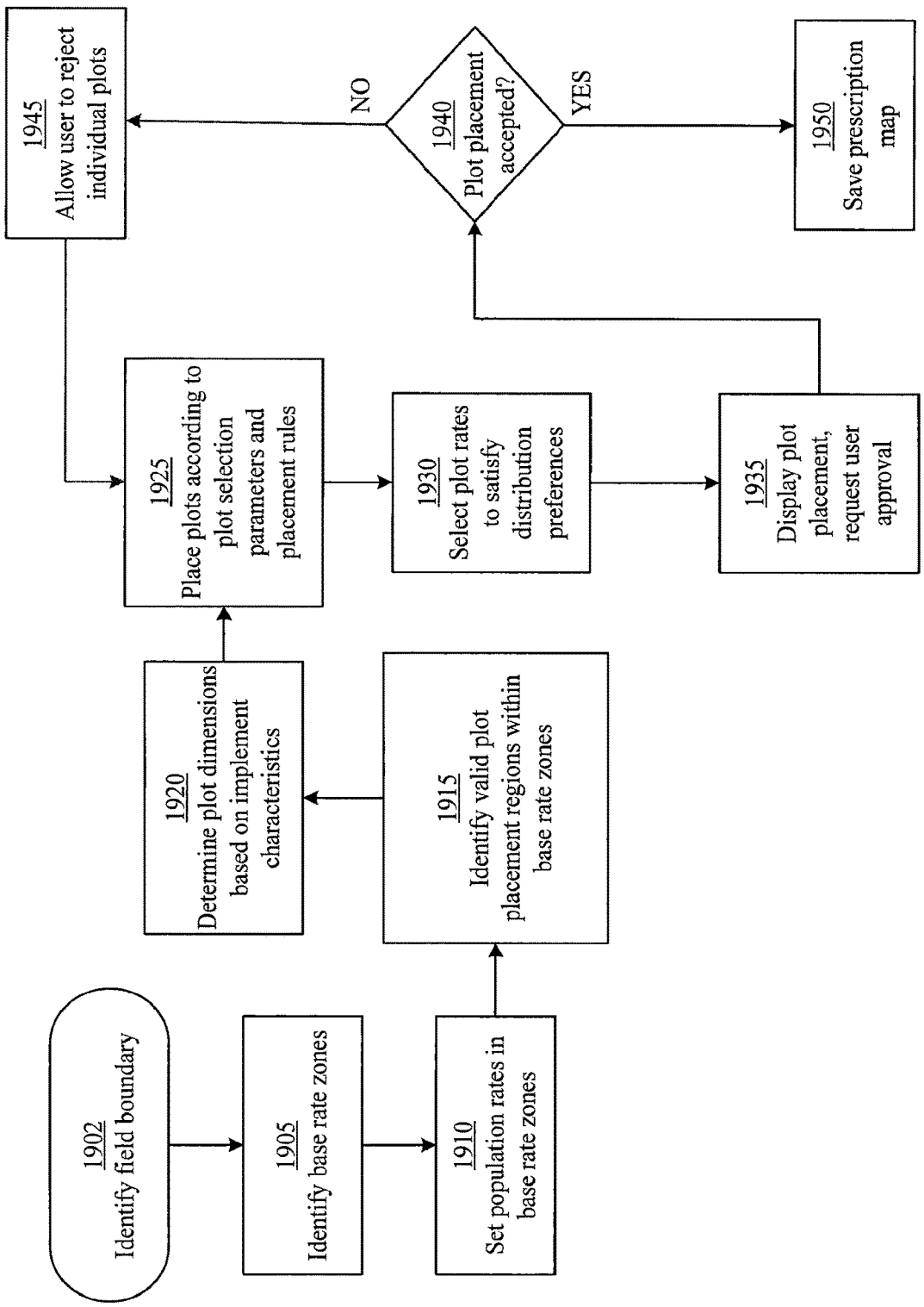
FIG. 14 illustrates an embodiment of a process for selecting test plot locations.

Continuing to refer to FIG. 14, at step 1915, the planter monitor 50 preferably identifies a valid plot placement region 1830 within each base rate zone 1810. As illustrated in FIG. 18, the valid plot placement regions 1830-1,1830-2 are identified as the regions separated from the field boundary 1830 and the base rate boundary 1820 by a certain minimum distance or minimum distances, which minimum distances are preferably determined as discussed herein with respect to FIG. 10.

Continuing to refer to FIG. 14, at step 1915, the planter monitor 50 preferably determines the plot dimensions based on the implement characteristics entered by the user at step 305 of process 300. This determination is preferably made as discussed herein with respect to FIG. 10. At step 1925, the planter monitor 50 preferably places plots 1850 (FIG. 18) within the valid plot placement regions 1830. The plot placement preferably satisfies the plot selection parameters entered by the user at step 305 of process 300. For example, the ratio between a total area of plots 1850 and a total area of the field boundary 1805 is preferably equal to the ratio selected by the user using interface 1430 of screen 1400 (FIG. 16). The plot placement preferably satisfies a set of plot placement rules preferably preloaded in the memory of the planter monitor 50. For example, the plot placement rules preferably require a minimum number of adjacent base rate cells 1852 having a minimum area. In some embodiments, the minimum number is three and the minimum area is the same as the area of plots 1850, resulting in the "checkerboard" pattern illustrated in FIG. 18. In other embodiments, the plot placement rules may require maximum possible distance between plots 1850 while still satisfying the desired total plot acreage.

Continuing to refer to FIG. 14, at step 1930, the planter monitor 50 preferably selects the plot rates to satisfy the distribution preferences entered by the user in step 305 of process 300. At step 1935, the planter monitor 50 preferably displays the proposed plot placement to the user and requests user approval of the plot placement, e.g., by displaying an interface 1890 (FIG. 18). At step 1940, if the proposed plot placement has been rejected, then at step 1945 the planter monitor 50 preferably allows the user to reject individual undesired plots, and then repeats steps 1925 through 1935 without placing a plot near the rejected location. Once the proposed plot placement is accepted, the planter monitor 50 saves a prescription map including the proposed plot placement at step 1950.

In some embodiments of the process illustrated in FIG. 14, the planter monitor 50 randomly selects among potential plot areas, displays the random selection to the user, and allows the user to reject individual plot areas or reject the entire map and request a different randomized set of plots.

Returning to FIG. 13, once the planned plot locations have been set the planter 10 preferably begins planting at the primary population rate (e.g., rate 110 in FIG. 4) at step 317. At step 320, upon encountering a plot boundary (e.g., boundary 162 in FIG. 4), the planter monitor 50 commands the rows crossing the boundary to plant at the plot population rate (e.g., rate 120 in FIG. 4). At step 322, the planter monitor 50 preferably displays a notification to the user that the plot population rate has been activated. The notification may comprise a map indicating the plot locations and the current location of the planter, or an alarm window. It should be appreciated that such a notification is preferred because most planter monitors continuously display the currently active population rate to the user, and an unexplained change in population during planting could confuse the user. The planter monitor 50 may also permit the user to override the plot during planting, e.g., by instructing the planter monitor 50 to command the primary population rate in spite of the previously planned plot.

At step 330, upon leaving the plot area (e.g., by crossing boundary 164 in FIG. 4), the planter monitor 50 again commands the primary population rate. At step 335, the planter monitor 50 preferably displays a notification to the user that the plot area has been exited. If the planter monitor 50 determines at block 337 that the entire plot has not been completed, then steps 320-335 are repeated each time the planter passes through another section of the plot (e.g., section 160-2 in FIG. 9). Once the planter monitor 50 determines that the entire plot has been completed, at step 340 the planter monitor 50 preferably verifies and stores the location of the completed plot.

Figure 17:
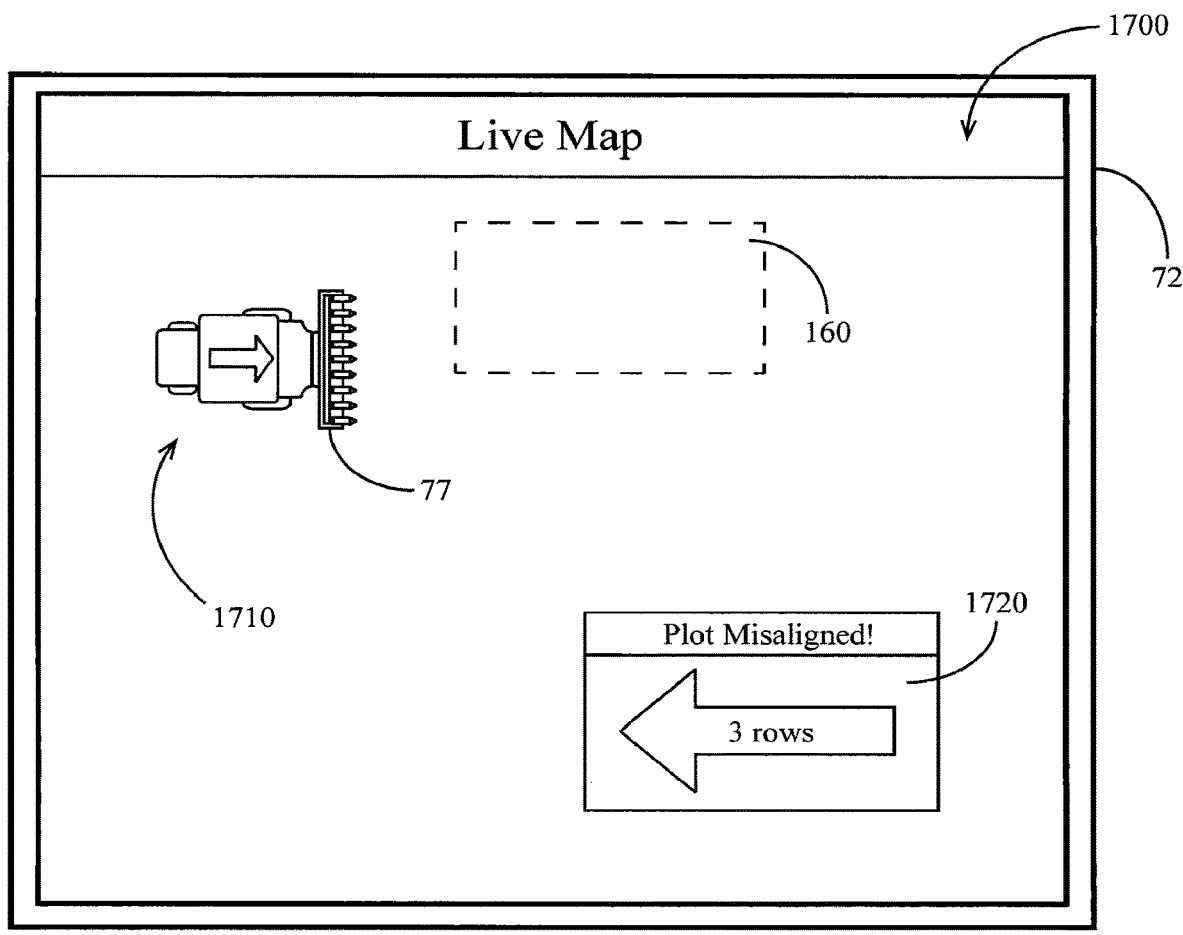
FIG. 17 illustrates an embodiment of a display screen for displaying the location of a test plot during harvesting operations.

Continuing to refer to FIG. 13, at step 341, the yield monitor 72 preferably prompts the user to enter the GPS offsets associated with the combine, i.e., the travel-direction and transverse offsets between the GPS device 75 and the row units of the combine. During harvesting at step 342, the yield monitor 72 preferably alerts the user to misalignment of the combine head 77 with each plot such that the head does not harvest crop outside the plot area together with crops planted at the base rate or other rates. This step may be accomplished using a head correction screen 1700 as illustrated in FIG. 17. The head correction screen 1700 preferably includes a map 1710 illustrating the alignment of the head 77 with the plot 160 and a visual indicator 1720 indicating the direction of any required correction and preferably the amount of correction expressed in an integer number of rows.

Figure 12:
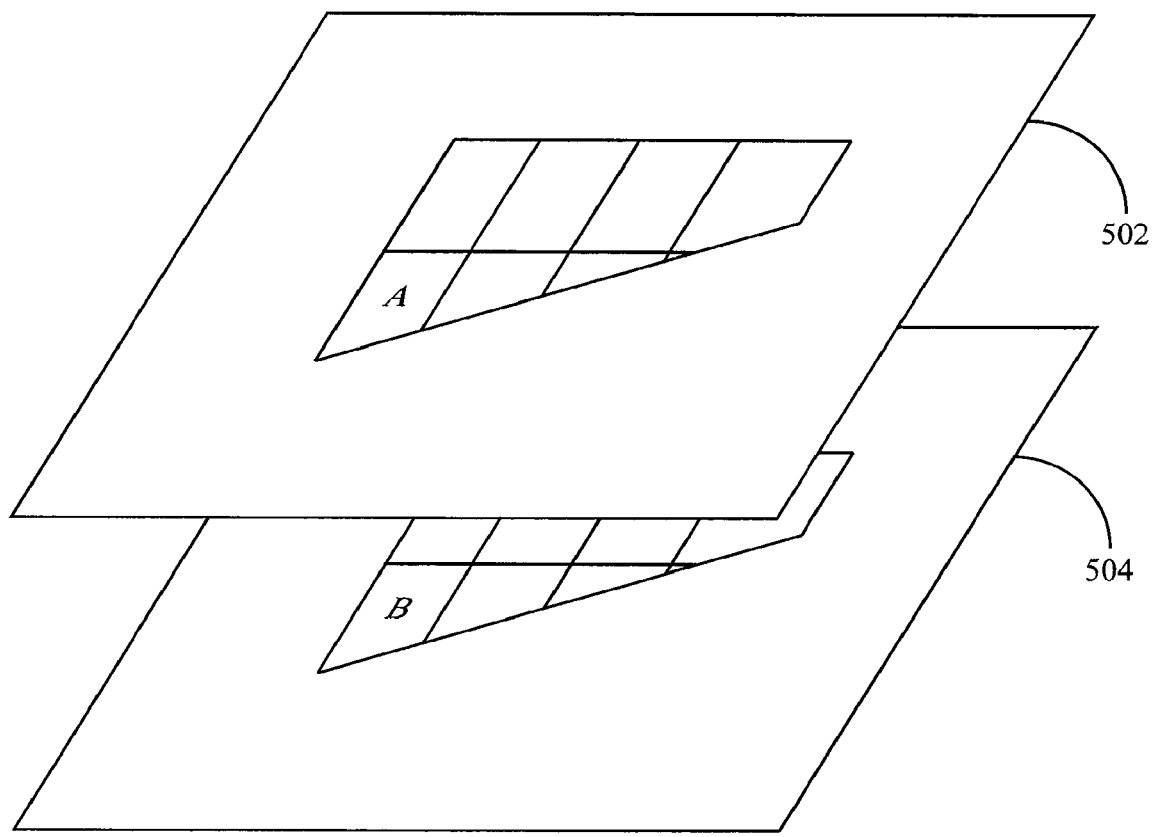
FIG. 12 illustrates the overlay of two layers of spatially referenced agricultural data.

Returning to FIG. 13, at step 345 the yield monitor 72 records the harvested yield for each location in the field. At step 350, the computer 450 (see system 400 of FIG. 3) analyzes the yield results by comparing the yield within the plot area with yields in other areas in the same field or other fields. The computer 450 overlays and compares population rates to yields for corresponding locations in the field. For example, as illustrated in FIG. 12, the computer 450 compares the population rate A in planting map layer 502 to the corresponding yield B in yield map layer 504.

Figure 15:
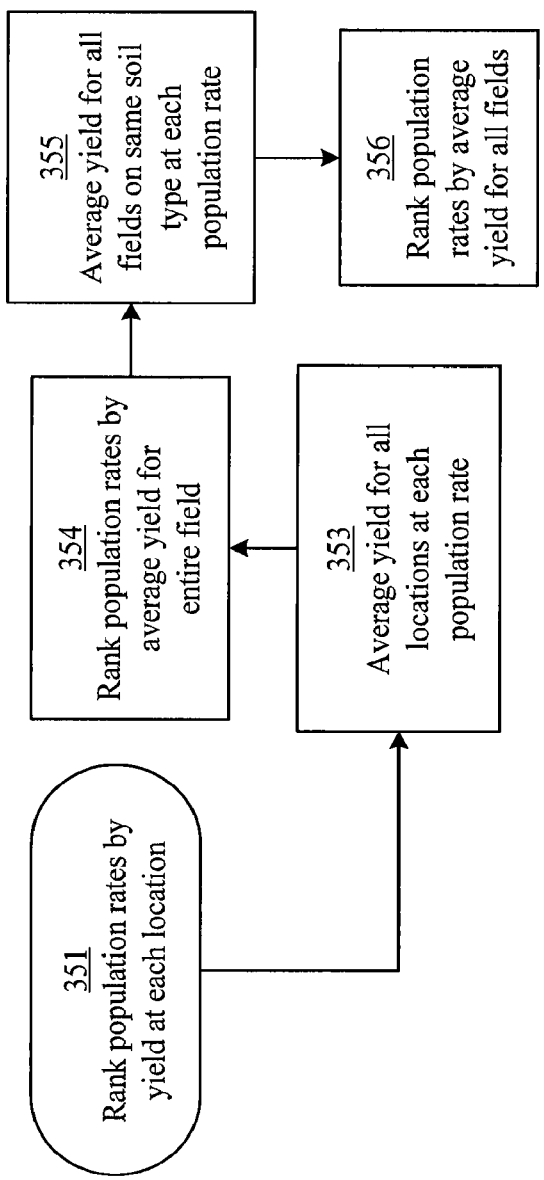
FIG. 15 illustrates an embodiment of a process for analyzing test plot yield results.

A preferred process for carrying out step 350 of FIG. 13 is illustrated in FIG. 15. At step 351, the computer 450 preferably ranks the prescription by yield at each location in the field. For example, if a master plot 150 was planted as illustrated in FIG. 8, the computer 450 would rank each population rate according to the resulting yield. A similar analysis is preferably performed where a set of side-by-side plots has been placed as illustrated in FIG. 7. At step 353, the computer 450 preferably determines an average yield for all locations in the field at each population rate. Thus an average yield is determined for each set of plots at which a given plot population rate was planted, as well as for the primary population rate. At step 354, the computer 450 preferably ranks the population rates according to their average yield across the entire field. At step 355, the computer 450 preferably obtains population rates and yield results for the same soil type from different fields uploaded from different computers 450-1 (see discussion with respect to system 400 of FIG. 3) and determines an average yield for each population rate across multiple fields. At step 356, the computer 450 preferably ranks the population rates by average yield for every field for which data was obtained at step 355.

In some implementations, comparisons between yields obtained from various population rates are performed across seasons. For example, the yield obtained from a given population rate for a particular field are preferably averaged with yields for the same population rate and field from prior years before comparison with other population rates.

Returning to FIG. 13, at step 360 the computer 450 generates a new prescription recommendation based on the yield analysis performed at step 350. For example, a new primary population rate may be recommended based on the first-ranked population rate for the entire field. Additionally, location-varying population rate may be recommended where different population rates were first-ranked in different areas of the field.

Although the systems and methods disclosed herein are illustrated and described with respect to the rate at which seeds are planted, in other embodiments the same systems and methods are be applied to other crop inputs applied using variable application implements other than planters. For example, in some embodiments the rate at which liquid fertilizer is applied using a variable rate application system is varied and the resulting yields are obtained after harvesting using the methods presented herein. In other embodiments, a system for planting different seed varieties during planting (e.g., those systems disclosed in U.S. Pat. Nos. 5,915,313 and 7,418,908, which are hereby incorporated herein in their entirety by reference) could be used to plant plots of different varieties using the methods presented herein.

The foregoing description is presented to enable one of ordinary skill in the art to make and use the invention and is provided in the context of a patent application and its requirements. Various modifications to the preferred embodiment of the apparatus, and the general principles and features of the system and methods described herein will be readily apparent to those of skill in the art. Thus, the present invention is not to be limited to the embodiments of the apparatus, system and methods described above and illustrated in the drawing figures, but is to be accorded the widest scope consistent with the spirit and scope of the appended claims.

What is claimed is:

1. A method for generating a plot in a field, the plot to be planted with a planter having row units, the method, comprising:
   receiving a set of plot selection parameters specifying plot characteristics of a plot in a field and a crop to be planted in the plot;
   based on a first crop yield of a first region, a second crop yield of a second region, and a third crop yield of a third region, dividing the field into at least the first region, the second region, and the third region, the first region assigned a first population rate of the crop planted in the first region, the second region assigned a second population rate of the crop planted in the second region, and the third region assigned a third population rate of the crop planted in the third region:
      ranking the first population rate, the second population rate, and the third population rate according to the first crop yield, the second crop yield, and the third crop yield;
      determining, for each of said first population rate, second population rate, and third population rate, average crop yields across the field and multiple different fields:
      ranking said first population rate, second population rate, and third population rate according to the average crop yields across the field and the multiple different fields; and
      generating, based on the set of plot selection parameters and a result of the rankings, a prescription map including the plot in the field, a first plot population rate of the crop to be planted at ones of multiple locations in the plot and a second plot population rate of the crop to be planted at different ones of the multiple locations in the plot, the first plot population rate being equal to the population rate ranked first based on the average yields, the second plot population rate being equal to the population rate ranked first based on the first, second, and third crop yields.

2. The method of claim 1, further including:
   controlling an application rate based on the prescription map.

3. The method of claim 2, further including:
   displaying a first location of the multiple locations of the plot during harvesting.

4. The method of claim 1, further including based on a set of implement characteristics, determining plot dimensions of the plot.

5. The method of claim 4, wherein the set of implement characteristics includes implement characteristics of equipment to be used in harvesting the field.

6. The method of claim 4, wherein the set of implement characteristics includes a width or number of rows of a combine head to be used in harvesting the field.

7. The method of claim 1, wherein the prescription map including the plot includes a geographic location of the plot.

8. The method of claim 7, wherein the set of plot selection parameters includes a risk preference.

9. The method of claim 7, wherein the set of plot selection parameters includes a fraction of acreage to be placed in plots.

10. A method of generating a seed population prescription map including multiple base rate zones, and multiple plots within each base rate zone, the method comprising:
    identifying a field boundary of a field;
    identifying multiple base rate zones within the field boundary;
    assigning a base population rate to each base rate zone;
    identifying valid plot placement regions within each base rate zone;
    determining plot dimensions based on an implement characteristic of an agricultural implement used to harvest a crop from at least one plot in the field, the implement characteristic including a width or number of rows of a combine head of the agricultural implement to be used in harvesting the field planted according to a prescription map;
    placing multiple plots in each of the multiple base rate zones based on at least a first placement rule, the first placement rule requiring, for each of the multiple plots, a minimum number of base rate cells adjacent to each of multiple sides of the multiple plots, the base rate cells having a minimum area; and
    generating, based on the plot dimensions and the placement, a prescription map including the multiple plots placed in the field.

11. The method of claim 10, further including: receiving second input that comprises a desired ratio between an area of the multiple plots and an area of a region enclosing the multiple plots.

12. The method of claim 10, further including:
    determining population rates within each of the multiple plots based on a third input.

13. The method of claim 12, wherein the third input includes a desired variation in population rates.

14. The method of claim 10, further including:
    providing a graphical user interface to accept or reject plot locations; and
    altering the placement of the multiple plots based on a rejection input received via the graphical user interface.

* * * * *